United States Patent
Andersen et al.

(10) Patent No.: US 7,113,525 B2
(45) Date of Patent: Sep. 26, 2006

(54) SEMICONDUCTOR MICRO-RESONATOR FOR MONITORING AN OPTICAL DEVICE

(75) Inventors: John Kai Andersen, Emmaus, PA (US); Newton C. Frateschi, Breinigsville, PA (US)

(73) Assignee: T-Newtorks, Inc., Allentown, PA (US)

( * ) Notice: Subject to any disclaimer, the term of this patent is extended or adjusted under 35 U.S.C. 154(b) by 250 days.

(21) Appl. No.: 10/857,426

(22) Filed: May 28, 2004

(65) Prior Publication Data

US 2004/0218640 A1 Nov. 4, 2004

Related U.S. Application Data

(62) Division of application No. 10/245,075, filed on Sep. 16, 2002, now Pat. No. 6,985,644.

(60) Provisional application No. 60/375,881, filed on Apr. 26, 2002.

(51) Int. Cl.
*H01S 3/10* (2006.01)

(52) U.S. Cl. .......................................... 372/20; 372/92

(58) Field of Classification Search .................. 372/20, 372/94, 21, 92, 98
See application file for complete search history.

(56) References Cited

U.S. PATENT DOCUMENTS

| | | | |
|---|---|---|---|
| 5,509,023 A | 4/1996 | Glance et al. | |
| 5,780,843 A | 7/1998 | Cliché et al. | |
| 5,802,084 A | 9/1998 | Bowers et al. | |
| 5,832,014 A | 11/1998 | Johnson | |
| 5,943,352 A | 8/1999 | Fee | |
| 5,955,749 A * | 9/1999 | Joannopoulos et al. | 257/98 |
| 6,009,111 A | 12/1999 | Corwin et al. | |
| 6,009,115 A | 12/1999 | Ho | |
| 6,014,237 A | 1/2000 | Abeles et al. | |
| 6,064,895 A | 5/2000 | Baumfalk et al. | |
| 6,130,969 A | 10/2000 | Villeneuve et al. | |
| 6,151,340 A | 11/2000 | Rivers | |
| 6,324,204 B1 | 11/2001 | Deacon | |
| 6,371,662 B1 | 4/2002 | Leard et al. | |
| 6,552,842 B1 * | 4/2003 | Simpson et al. | 359/318 |

OTHER PUBLICATIONS

Sai T. Chu et al., An Eight-Channel Add-Drop Filter Using Vertically Coupled Microring Resonators over a Cross Grid, IEEE Photonics Technology Letters, vol. 11, No. 6, Jun. 1999, pp. 691-693.

* cited by examiner

*Primary Examiner*—Minsun Oh Harvey
*Assistant Examiner*—Tuan Nguyen
(74) *Attorney, Agent, or Firm*—RatnerPrestia

(57) ABSTRACT

An optical device includes an optical waveguide through which light propagates and a micro-resonator structure including an optical sensor. The micro-resonator is configured to resonate at a wavelength of light that may be transmitted through the optical waveguide. When light at that wavelength is transmitted through the optical waveguide, it resonates in the resonator and is detected by the optical sensor to produce an electrical signal. The optical resonator may be a micro-cylinder, disc or ring resonator and may be coupled to the waveguide via evanescent coupling or leaky-mode coupling. Multiple resonators may be implemented proximate to the waveguide to allow multiple wavelengths to be detected. When the waveguide is coupled to a tunable laser, signals provided by the optical sensor may be used to tune the wavelength of the laser.

11 Claims, 13 Drawing Sheets

SEMICONDUCTOR MICRO-RESONATOR FOR MONITORING AN OPTICAL DEVICE

This application is a divisional application of U.S. application Ser. No. 10/245,075, filed Sep. 16, 2002, now U.S. Pat. No. 6,985,644 which claims benefit of priority from U.S. provisional application No. 60/375,881 filed Apr. 26, 2002 the contents of which are incorporated herein by reference.

BACKGROUND OF THE INVENTION

The present invention relates to optical monitoring devices and in particular to a micro-resonator which is coupled to an optical device to produce an electronic signal when the wavelength of the light provided in the optical device is within the resonance bandwidth of the micro-resonator.

Optical monitors are used with many optical devices. They may be used, for example, to determine the wavelength and/or optical power of light produced by a semiconductor laser in order to tune the laser. Optical monitors may also be used to determine the losses in an optical system, such as a electro-absorptive modulator or semiconductor optical amplifier, by measuring both the input energy and output energy of the system either over a broad band of wavelengths or in a specific narrow band. In the materials that follow, it is assumed that the light to be measured is propagating through a waveguide or is generated in an optical gain medium. In the material that follows, the term "waveguide" includes both traditional waveguides and gain media. Furthermore, the term light is used to indicate any radiation that may be transmitted via an optical waveguide.

An important use for optical monitoring systems is in tuning communications lasers. Communications lasers operating in a dense wavelength division multiplexing (DWDM) system are desirably especially finely tuned to be able to provide the closely spaced channels defined for this standard. Exemplary channels for a DWDM system are defined as $v_n = v_0 \pm n dv$, where $v_0$ is the central optical frequency, (e.g. 193.1 THz) and dv is the channel spacing (e.g. 100 GHz or of 50 GHz).

Typical semiconductor lasers are able to be tuned in a range of 30–40 nm while maintaining acceptable power levels. Tunable semiconductor lasers may be a distributed feedback (DFB) laser, a distributed Bragg reflector (DBR) laser or other laser that uses distributed mirrors. Tunable lasers may also be more conventional lasers having a resonant cavity that includes at least one Fabry-Perot cavity as a reflector. In each of these lasers, the resonant wavelength may be tuned by electrically or thermally adjusting the "optical length" between the reflectors. The optical length may be adjusted by changing the actual length and/or the index of refraction of the material between the reflectors. Although not explicitly described herein, pressure, as applied by one or more piezoelectric elements, may also be used to adjust the index of refraction.

A typical laser tuning system couples the light provided by the laser is coupled to a waveguide. A portion of the light traveling through the waveguide is tapped, for example, by splicing an optical fiber through the cladding of the waveguide. This tapped light may be applied to one or more optical filters that separate light having a particular wavelength and then to an optical sensor, such as a photodiode. The light tapped from the waveguide may also be directly detected by an optical sensor to determine the power level of the laser. Splicing optical fibers to the output fiber to tap the light may cause undesirable power loss or scattering of light that may result in increased noise or feedback into the laser.

The signals provided by the optical sensors may be applied to control circuitry that adjusts the temperature of the laser or its reflectors or adjusts an electrical potential applied to the reflectors. This circuitry changes the resonant wavelength of the laser to center it within a predetermined communications channel.

Thus, considerable circuitry, separate from the semiconductor laser, is typically used to tune the laser.

SUMMARY OF THE INVENTION

The present invention is embodied in an optical structure including an optical waveguide through which light propagates and a micro-resonator structure, configured to receive light from the waveguide and including an optical sensor. The micro-resonator is configured to resonate at a wavelength of light that may be transmitted through the optical waveguide. When light at that wavelength is propagating through the optical waveguide, it resonates in the resonator and is detected by the optical sensor to produce an electrical signal.

According to one aspect of the invention, the micro-resonator structure is formed as an optical sensor.

According to another aspect of the invention, the micro-resonator is a micro-cylinder.

According to yet another aspect of the invention, the micro-resonator is positioned with respect to the optical waveguide so that light propagating through the waveguide is received by the micro-resonator via evanescent coupling.

According to yet another aspect of the invention, the micro-resonator is positioned to intersect a portion of the optical waveguide so that light propagating through the waveguide is received by the micro-resonator through leaky-mode coupling.

According to another aspect of the invention, the device includes a plurality of micro-resonators, each having a respectively different resonant wavelength so that light having multiple different wavelengths may be detected.

According to another aspect of the invention, the waveguide is coupled to receive light from a tunable laser and the electrical signal provided by the micro-resonator provides a feedback signal to tune the laser.

BRIEF DESCRIPTION OF THE DRAWINGS

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE EXEMPLARY EMBODIMENTS

Figure 1A:
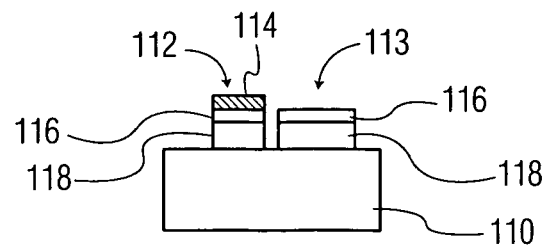
FIGS. 1A, 1B and 1C are a side-plan view, front-plan view and top plan view of an optical device which includes a first embodiment of the subject invention.
Figure 1B:
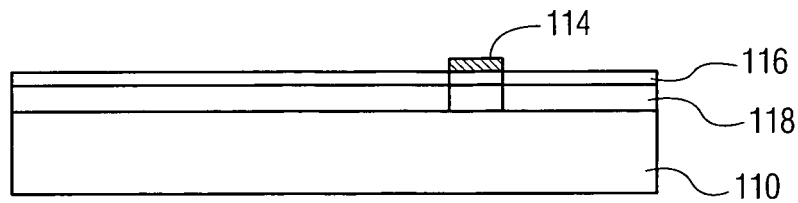
Figure 1C:
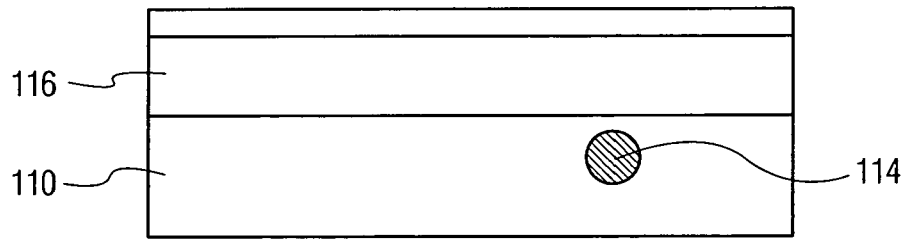

One exemplary embodiment of the present invention, illustrated in FIGS. 1A, 1B and 1C, is monitored waveguide device 100 including a waveguide 113 and a micro-cylinder 112. FIG. 1A is a side plan drawing, FIG. 1B is a front plan drawing and FIG. 1C is a top plan drawing of the of device 100. The exemplary device includes a substrate 110, wave guide layer 118 and cladding layer 116. Waveguide material 118 desirably exhibits low optical loss and a relatively high index of refraction in the desired wavelength band. Although, in the devices described below, the waveguide material 118 may be various III/V materials, such as InP, GaAs, AlGaAs, or InGaAsP, other possible materials choices are contemplated. Possible alternatives for the waveguide material 118 include: doped silica (similar to optical fibers); silicon; germanium; and dielectric materials such as SiO$_2$ and SiN, which have low optical loss characteristics for the desired wavelength band.

Cladding layer 116 and substrate 110 desirably have a lower index of refraction than the waveguide material 118 and act as cladding layers. The materials for these layers may desirably be selected from a related family of materials to the material used to form waveguide layer 118. Such a material selection may minimize scattering at the boundaries between layers and may also improve the quality of crystalline materials by reducing lattice mismatches between layers. For example, the substrate 110 and the cladding layer 116 may be formed from InP, while the waveguide layer 118 may be formed from different alloys of, for example, InGaAsP, layered to form one or more quantum well structures.

Additionally, waveguide layer 118 may contain a number of sub-layers, forming a quantum well structure within this layer. A quantum well waveguide structure may be desirable to increase the tunability of the index of refraction within the waveguide. This structure may include a single quantum well, multiple quantum wells, or separate confinement layers. Substrate layer 110 and cladding layer 116 may also contain a plurality of sub-layers. In some of the embodiments, described below, the cladding layer 116 extends around the waveguide on the sides as well as over the top of waveguide 118, as shown, for example, in FIG. 5A. When the cladding layer 116 extends around the sides of the waveguide, it is desirably a dielectric material so that it does not interfere with the electrical operation of the waveguide 118 when, for example, the waveguide is an active optical device, such as an optical gain medium.

In addition to serving as a cladding layer, cladding layer 116 may also desirably function as the p-type material of a P-I-N structure with the substrate 110 forming the n-type material and the waveguide material 118 forming the intrinsic or i-type material.

The exemplary monitored waveguide device 100 also includes a micro-cylinder 112 which may be formed from the same material as the waveguide 113. The exemplary embodiment, micro-cylinder 112 includes a resonator layer that may be formed from the waveguide material 118, a cladding layer 116 and an electrical contact 114, that may be formed from a metal, such as Al, Au, Ag, Cu, Ni, Ti, W or a combination thereof or of another conductor such as polysilicon or polyaniline. The exemplary micro-cylinders used in the subject invention are configured to sense photocurrents induced by light near the desired resonant wavelength. In the exemplary embodiments of the invention, this may be achieved by several methods. First, the waveguide layer from which the micro-cylinder resonator is formed may include a quantum well structure. Photocurrents in a quantum well structure may be detected using a substrate contact and a contact coupled to the cladding layer 116. Second, the micro-cylinder resonator may be formed from a bulk material and the photocurrent may be sensed directly as in a photodiode or as a change in the conductance of the material as a photoresistor. Third, the micro-cylinder resonator may be formed from a dielectric material but positioned proximate to a photodetector (not shown) such that when the micro-cylinder receives light at the resonant frequency, the resonant light energy in the micro-cylinder is detected by the photodetector. For example, the photodetector may be a photodiode formed in the substrate 110 and the micro-resonator may be formed immediately above the photodiode.

The micro-cylinder resonators used in the present invention desirably operate in a whispering gallery mode. The circumference of the cylinder is ideally equal to an integral multiple of the wavelength at which the device is to be in resonance. Therefore, the circumference of the cylinder determines the resonant wavelengths of the cavity, as well as the free spectral range, or wavelength difference between resonant whispering gallery modes. If the cylinder is large enough then the free spectral range may be smaller than the useful wavelength range of the waveguide. Therefore it may be desirable to size the micro-cylinder so that its free spectral range (FSR) matches the desired channel spacing. It is contemplated, however, that micro-cylinders having FSRs that are larger or smaller than the channel spacing may be used.

The minimum size of the micro-cylinder resonators is determined by acceptable losses. As the size or the cylinder decreases, the curvature of the light path increases. Increased curvature of the light path increases cavity losses in the micro-resonator. Increasing the index of refraction of the micro-resonator material may decrease these cavity losses. Therefore, it may be desirable to form the micro-cylinder from materials that have a relatively high index of refraction. Also, to assist with the formation of curved surfaces of the resonator it may be desirable for the resonator material to be formed using dry etchant or an etchant having a relatively high viscosity so as to avoid producing polygonal features that may result from preferential etching along crystal planes which may cause the light to propagate in modes other than the whispering gallery mode. By using sub-micron semiconductor fabrication techniques to improve surface smoothness, high finesse, low loss, micro-cylinder resonators may be fabricated. These resonators may effectively select one wavelength channel out of a large number of wavelength channels.

For small discs that exhibit low losses, the resonances may be expressed by equation (1), $$\lambda_M^N = \frac{2\pi n}{X_M^N}, \qquad (1)$$

where, n is the refractive index and $X_M^N$ is the Nth zero of the Bessel function J of order M ($J_M$). For whispering gallery modes, N=1.

For large discs, R>>$\lambda_0$ of operation, resonances may be expressed by equation (2).

$$\lambda_m = \left(\frac{4\pi R}{m}\right) n, m = 1, 2, \ldots \qquad (2)$$

Centered at $\lambda_0$<<R, the free spectral range is given by equation (3), $$FSR = \left(\frac{1}{4\pi}\right)\frac{\left(\frac{\lambda_0}{n}\right)^2}{R}. \qquad (3)$$

For $\lambda_0 \approx$ 1550 nm, n=3.2 and a Γ=0.4 nm is achieved with R=50 μm. For 50 μm discs the resonate peaks are separated by 0.4 nm. In order to shift the resonance peaks a voltage or current is used to bias the device and change the index of refraction by an amount $\Delta\lambda_m$, given by equation (4).

$$\Delta\lambda_m = \left(\frac{4\pi R}{n}\right)\Delta n \qquad (4)$$

With the maximum feasible Δn change being 0.01. Appropriate tuning of the resonant peaks may be easily achieved with Δn approximately equal to 0.001, as shown in equations (5) and (6).

$$\frac{\Delta\lambda_m}{\lambda_m} = \frac{\Delta n}{n} \approx \frac{0.01}{3.2} = 0.03, \qquad (5)$$

$$\Delta\lambda_m|_{1550} \approx 0.5 \text{ nm}. \qquad (6)$$

The micro-cylinder resonators of some embodiments of the present invention are designed to selectively couple to evanescent optical fields that surround the waveguides. An evanescent optical field is the portion of the optical field of the light being guided by a waveguide that extends beyond the physical surface of the waveguide. The intensity of the evanescent optical field decays exponentially with distance outside the physical surface of the waveguide. The high finesse of the micro-cylinder resonators desirably employed in one embodiment of the present invention allows even relatively small evanescent optical field intensities to couple readily detectable signals from the waveguide 113 to the micro-cylinder 112, but only in relatively narrow ranges about the resonant wavelengths of the micro-cylinder 112. Additionally, in some embodiments of the invention, this use of evanescent coupling allows relatively small signals to be transferred from the waveguide 113 without physical contact between the waveguide 113 and the micro-cylinder resonator 112. Physical contact between the micro-cylinder results in scattering and may introduce undesirable additional modes in the waveguide 113. The use of evanescent coupling of the high-finesse micro-resonator 112 to the waveguide 113 allows the detection of tuning signals that are strongly wavelength dependent with minimal disturbance of the optical signal.

The exemplary monitored waveguide devices described below may be used to tune communications lasers for DWDM communications systems. In this environment, the high finesse of the resonant micro-cylinder 112 may be undesirable as it may not receive light from the laser when it is even slightly detuned from its ideal wavelength. Accordingly, in some of the embodiments described below, features are introduced that decrease the finesse of the micro-cylinder, allowing light in a broader range of wavelengths to be coupled to the micro-cylinder. Decreasing the finesse may also increase the free spectral range of the micro-cylinder. As described below, this may be useful for tuning a laser over a wide band of wavelengths.

Although the device 113 is described as a waveguide, it may also be an active optical component, such as a laser, an optical amplifier, an optical attenuator or an electro-absorptive modulator (EAM). For any of these devices, the micro-cylinder resonator 112 may be placed in the same position with respect to the active device as it is placed with respect to the waveguides described below.

Figure 2:
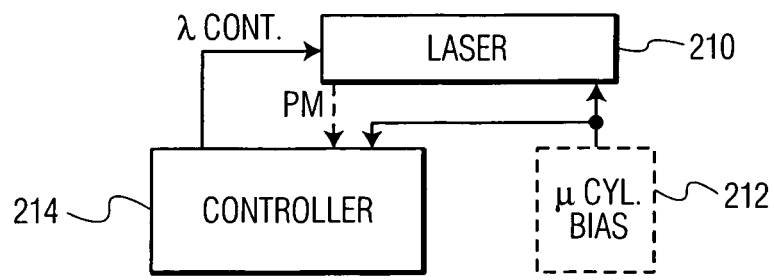
FIG. 2 is a block diagram of a laser wavelength control circuit which includes an embodiment of the subject invention.

FIG. 2 is a block diagram of an exemplary laser tuning circuit that may be used with a monitor according to the present invention. The exemplary circuit comprises a tunable laser 210 that includes a waveguide (not shown) and micro-cylinder (not shown) according to the present invention. The micro-cylinder is coupled to receive an optional micro-cylinder bias signal 212, that may be used to change the refractive index of the micro-cylinder and, so, change its resonant frequency. The micro-cylinder is also coupled to provide a signal, that is proportional to the induced photocurrent, to a controller 214. The control circuit may also receive an optional output signal PM from the laser 210 indicating the instantaneous power level of the light being emitted by the laser. Exemplary power monitor devices are described below. The controller 214 provides an output signal λ CONT which is used to control the wavelength of the laser. In the exemplary embodiments of the invention described below, the laser is a semiconductor laser that may be tuned thermally, electrically or by a combination of thermal and electrical stimulus. Thermal stimulus may be applied, for example, using a thermo-electric (TE) cooler (not shown). Electrical stimulus may be applied, for example, to one or more Fabry-Perot reflectors (not shown) or to one or more passive dynamic feedback sections (not shown) of the lasers to change their refractive index and thus to change the wavelength of the reflected light and, thus, the wavelength of the light produced by the laser.

Referring to FIGS. 1A, 1B and 1C, the exemplary micro-cylinder 112 is a relatively high-finesse device and is positioned in close proximity to the waveguide 113. In this embodiment, the micro-cylinder 112 is configured to resonate at a desired wavelength of the laser light provided via the waveguide 113. When the laser light is at the desired frequency, the sensed photocurrent provided by the resonator is at a relatively high level. When the wavelength of the light shifts away from the desired wavelength, the sensed photocurrent decreases to a relatively low level. Because the micro-cylinder 112 a relatively high-finesse device, it has resonant peaks with a very narrow width compared to the free-spectral range and it is desirably placed in close proximity to the waveguide 113. Accordingly, its dimensions and index of refraction are carefully controlled to produce a photocurrent at the desired wavelength. The criticality of the dimensions of the micro-cylinder 112 may be reduced if, as in the exemplary embodiment of the invention, the micro-cylinder includes a quantum well structure or other structure (e.g. bulk semiconductor material) having an index of refraction that may be adjusted in response to a pressure or temperature change or to an electrical current or voltage applied between the contact 114 and the substrate 110. A change in the refractive index of the micro-cylinder results in a change in its resonant frequency. Thus, in this exemplary embodiment of the invention, shown in FIGS. 1A, 1B and 1C, both the laser and the micro-cylinder monitor may be tuned.

Figure 3A:
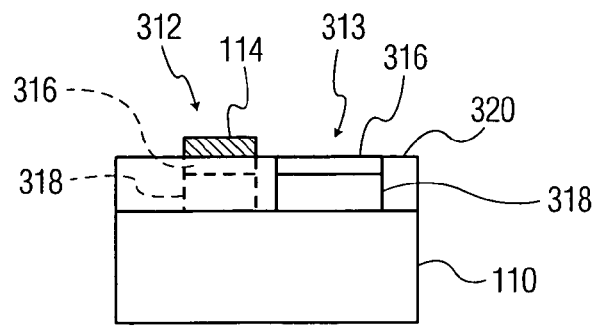
FIGS. 3A, 3B and 3C are a side-plan view, front-plan view and top plan view of an optical device that includes a second embodiment of the subject invention.
Figure 3B:
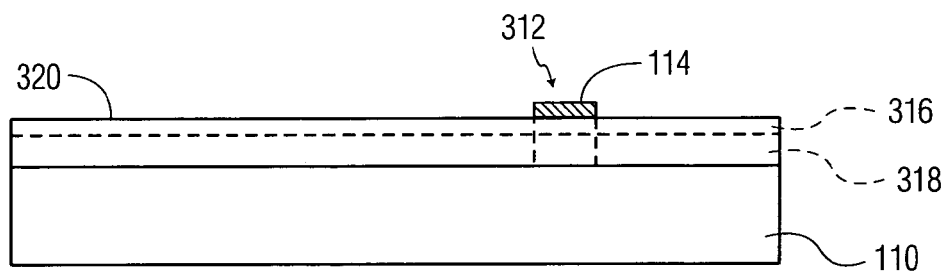
Figure 3C:
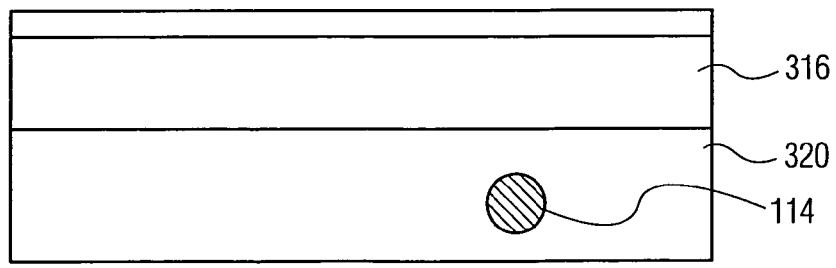

FIGS. 3A, 3B and 3C are side, front and top-plan views of a first alternative embodiment of the invention. In this embodiment, a cladding material 320 having a refractive index greater than air but less than the refractive index of the waveguide material 318 surrounds the waveguide 313 and the micro-cylinder 312. In this exemplary embodiment, waveguide may be a quantum well structure formed from III/V materials and the cladding material 320 may be a dielectric such as $SiO_2$, SiN or polyimide. The addition of the material 320 allows the micro-cylinder 312 to be positioned at a greater distance from the waveguide 313. It also reduces the finesse of the micro-cylinder 312. This reduced finesse may be desirable for a laser tuning device because the reduced finesse also results in an increase in the width of the resonant peaks, allowing light at wavelengths in a band around the desired wavelength to be coupled to the micro-cylinder 312. The exemplary waveguide 313 includes the waveguide material 318 positioned on the substrate 110 and a cladding layer 316. The exemplary micro-cylinder 312 is also formed from the waveguide material 318 and the cladding material 316, and further includes the metal contact 114, described above. In this exemplary embodiment, the waveguide material 318 may include a single quantum well, multiple quantum wells or even bulk semiconductor material. Consequently, the resonant wavelength of the micro-cylinder 312 may be adjusted as described above.

Although not explicitly described below, it is contemplated that any of the exemplary embodiments of the invention, including the embodiment described above with reference to FIGS. 1A, 1B and 1C may be implemented with a cladding material 320 which surrounds the waveguide and the resonator, as shown in FIG. 3.

Figure 4A:
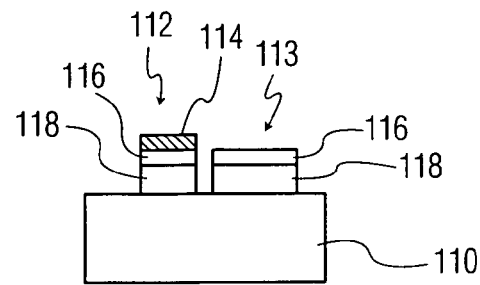
FIGS. 4A, 4B and 4C are a side-plan view, front-plan view and top plan view of an optical device including a third embodiment of the subject invention.
Figure 4B:
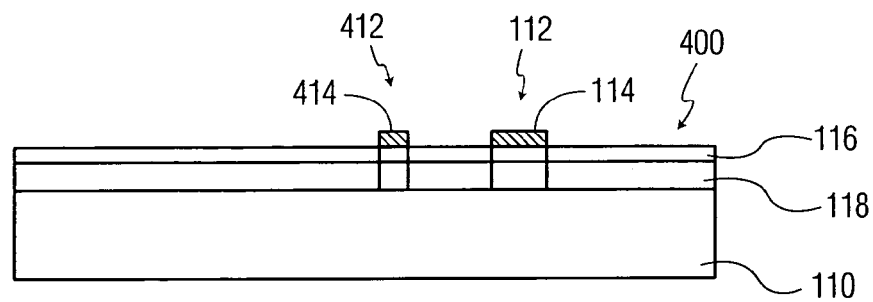
Figure 4C:
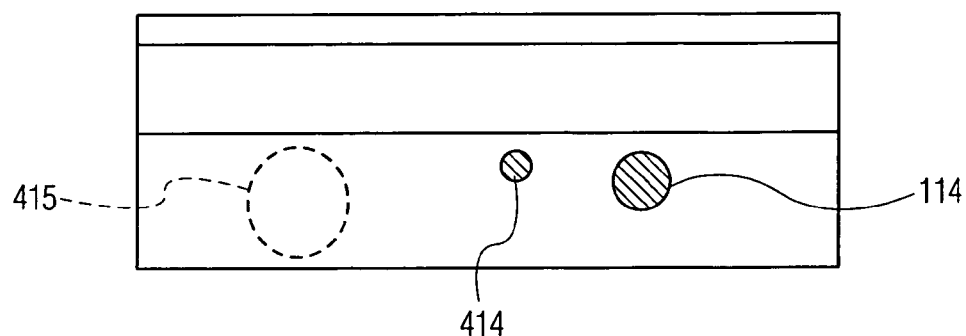

FIGS. 4A, 4B and 4C are respective side, front and top-plan views of another alternative embodiment of the invention. This embodiment is the same as either of the embodiments described above except that it also includes a power monitor structure 412. The exemplary power monitor micro-structure 412 may formed in the same way as the micro-cylinder resonator 112 or 312 but having a much smaller diameter. A device of this type does not resonate in the range of wavelengths that are of interest. Because it does not resonate, the power monitor structure may have a shape (not shown) other than a disc. For example, it may be a small rectangular shape. The micro-structure 412 is formed on top of the substrate 110 from the waveguide layer 118 and cladding layer 116 and further including an electrical contact 414. The electrical contact 414 and a further electrical contact (not shown) on the substrate 110 are used to sense a photocurrent or photoresistance in the micro-structure 412 which changes in response to light propagating through the waveguide 113.

Due to its small size, the micro-structure 412 does not resonate at any wavelength in the tunable bandwidth of the exemplary waveguide 116, either in whispering gallery mode or in modes across the diameter or other dimension of the device. Thus, the photocurrent evanescently radially coupled into the micro-structure 412 is proportional to the optical energy flowing through the waveguide 113 irrespective of its wavelength. Consequently, the photocurrent or photoresistance sensed using the micro-structure 412 represents the power level of the optical signal propagating through the waveguide 113. The embodiment of the invention described above with reference to FIG. 3 may be especially useful with the addition of micro-structure 412. As described above, although the power detector micro-structure is shown as a micro-cylinder, it may have other shapes, such as rectangular or semi-circular. Indeed, these shapes may be more advantageous as they increase the area through which evanescent coupling may occur, thus increasing the induced photocurrent in the photodetector of the device.

Alternatively, the power monitor may be formed from a large disc 415 (shown in phantom in FIG. 4C) which exhibits multiple closely spaced resonant modes. Because of its relatively large number of closely spaced resonant modes, this power monitor 415 effectively "resonates" at all wavelengths of interest. This type of power monitor may be more sensitive than the small-dimensioned monitor, described above, and, so, may be more desirable for a given application.

In the exemplary embodiment of the invention, the power monitor may be used in the control system 214, shown in FIG. 2, to allow the controller to distinguish between changes in the optical power signal sensed by the micro-cylinder 112 resulting from a shift in the wavelength of the signal being provided by the waveguide 113 and changes in the power level of the signal propagating through the waveguide 113.

Figure 5A:
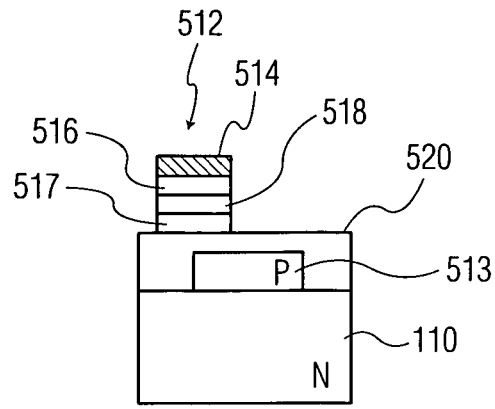
FIGS. 5A, 5B and 5C are a side-plan view, front-plan view and top plan view of an optical device comprising a fourth embodiment of the subject invention.
Figure 5B:
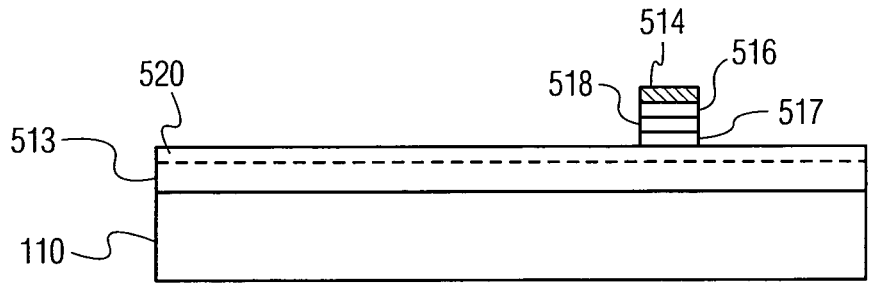
Figure 5C:
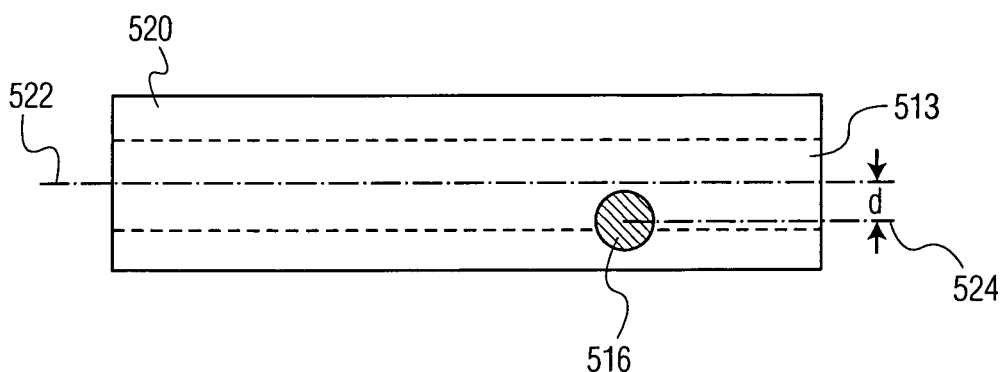

FIGS. 5A, 5B and 5C are, respectively, side, front and top-plan views of an alternative embodiment of the invention in which the micro-cylinder 512 is formed above a waveguide 513. In this embodiment of the invention, the waveguide 513 is formed on top of the substrate 110 and is encapsulated in a cladding material 520. The micro-cylinder resonator 512 is formed on top of the cladding material 520 and, in the exemplary embodiment of the invention, includes an N-layer 517, a intrinsic or quantum well layer 518, a P-layer 516 and a metal contact 514. The cladding material 520 may be, for example, an intrinsic semiconductor material on which the N-type material 517 may be deposited or grown.

As shown in FIGS. 5A and 5C, the center 524 of the micro-cylinder 512 is offset from the center line 522 of the waveguide 513 by a distance d. This separation allows optical signals propagating through the waveguide 513 to evanescently couple into the whispering gallery mode of micro-cylinder 512.

Figure 6A:
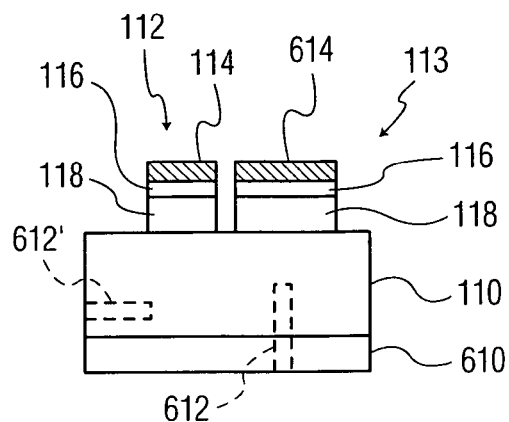
FIGS. 6A, 6B and 6C are a side-plan view, front-plan view and top plan view of an optical device which includes a fifth embodiment of the subject invention.
Figure 6B:
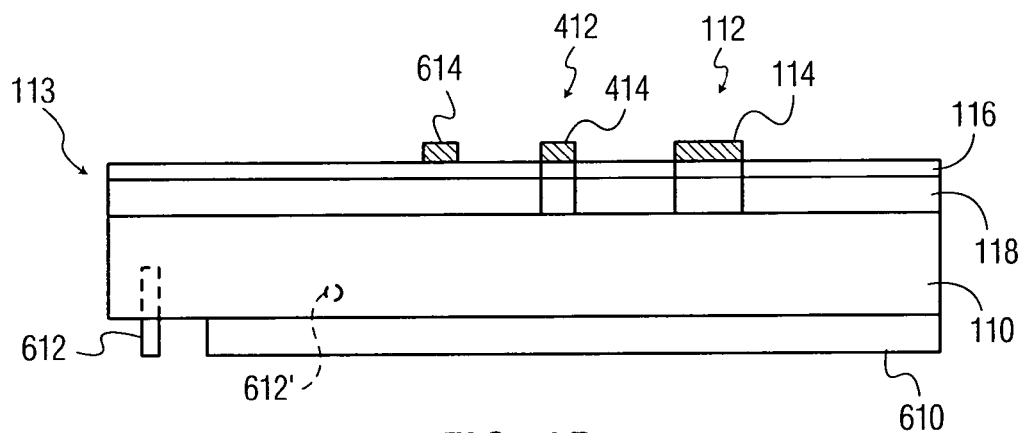
Figure 6C:
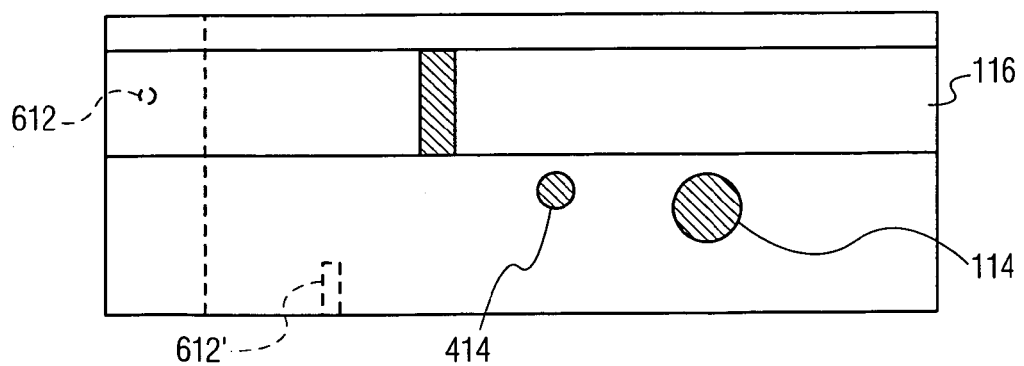

FIGS. 6A, 6B and 6C are side, front and top-plan views of yet another exemplary embodiment of the invention. This embodiment includes a temperature control element 610 such as a resistive heating element or a TE cooler which is used to adjust the refractive index of the waveguide material 118. This alternative embodiment also includes a temperature probe 612, to control the operation of the element 610 and an alternative optical power measuring device 614. Otherwise, the apparatus shown in FIGS. 6A, 6B and 6C is identical to the apparatus described above with reference to FIGS. 4A, 4B and 4C.

In the exemplary embodiment of the invention, the waveguide layer 118 includes a single or multiple quantum well structure and an electrical contact 614 configured across the P-type cladding material 116 that covers the waveguide material 118. This metal contact be used to sense a photocurrent induced by light flowing through the waveguide material 118 without significantly affecting the transmission of the light. Thus, signals between the electrical contact 614 and an electrical contact (not shown) on the substrate 110 may be used instead of signals provided by the micro-structure 412 to sense the power of the light propagating through the waveguide 118.

The temperature control element 610 may be used to increase or decrease the temperature of the substrate 110, and thus, the waveguide material 118, in order to control the refractive index of the waveguide material. If the waveguide material is an optical gain medium for a semiconductor laser, the change in temperature may change the wavelength of the laser light. The temperature probe 612 is used to sense the temperature of the substrate to determine if the temperature control element may be used to adjust the temperature of the substrate and, if it may be used, to determine the level of current needed to achieve the desired adjustment. The exemplary temperature probe 612 is shown as being inserted into the bottom surface of the substrate. This is only one of several possible positions for the probe. It is contemplated, for example, that a probe 612' may be inserted into the side of the substrate.

Furthermore, as shown in FIGS. 6A, 6B and 6C, the TE cooler 610 covers much of the bottom surface of the substrate 110. In an alternative embodiment of the invention (not shown), where the laser includes Fabry-Perot or diffractive optical reflectors (not shown), a TE cooler may be implemented locally beneath each reflector to selectively change only the refractive index of the reflector in order to change the wavelength of the light produced by the laser.

Although not explicitly described above or below, it is contemplated that one or more TE coolers such as that shown in FIGS. 6A, 6B and 6C may be used in any of the embodiments of the invention to adjust the refractive index of the devices as desired to control the wavelength of light emitted by the device. Because adjustment of the wavelength by cooling or heating the device is a relatively coarse adjustment which takes some time to complete, it may be desirable to use a combination of temperature and electrical control of the device. The TE cooler may be used, for example, to implement a coarse change in the refractive index of the device while electrical signals may be used to implement a small change. Using these two methods, any of the devices shown in FIGS. 1A–1C and 2A–13C may be controlled to provide light at a desired wavelength.

Figure 7A:
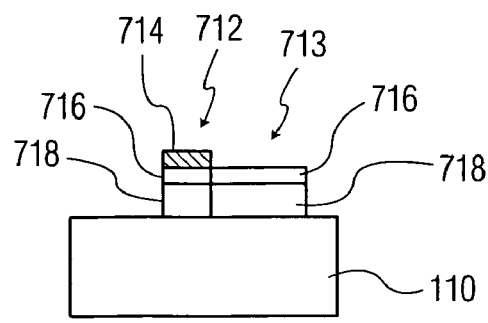
FIGS. 7A, 7B and 7C are a side-plan view, front-plan view and top plan view of an optical device that includes a sixth embodiment of the subject invention.
Figure 7B:
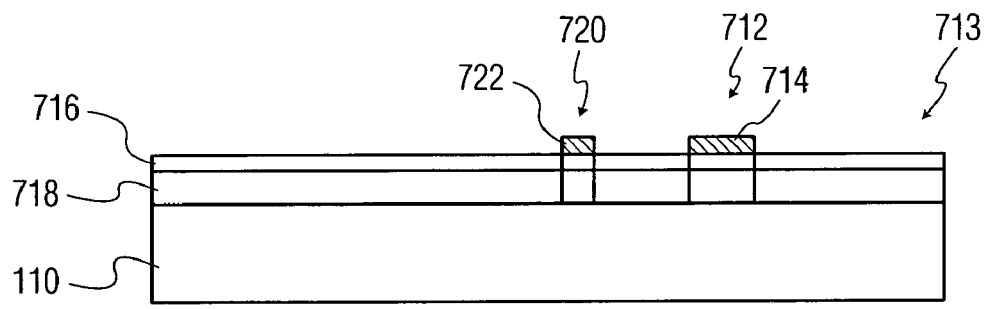
Figure 7C:
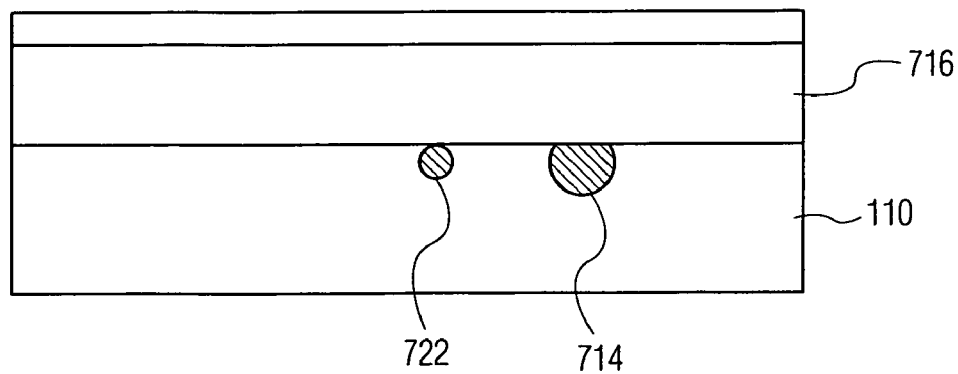

FIGS. 7A, 7B and 7C are respective side, front and top-plan views of yet another embodiment of the invention. In this embodiment, micro-cylinder structures 712 and 720 are physically coupled to the waveguide 713 so that leaky-mode coupling is used to transfer light from the waveguide 713 to the resonator 712 and the structure 720. As in the previous examples, the device is formed on a substrate 110 using a waveguide layer 718 and a cladding layer 716. The waveguide 713, the tuning micro-resonator 712 and the power monitor structure 720 are all formed from these three layers. In addition, the structures 712 and 720 each include a respective contact layer 714 and 722.

In operation, light propagating through the waveguide 713 scatters into the micro-cylinder structures 712 and 720 at the points along the waveguide 713 which are in contact with the structures 712 and 720. Because they contact the waveguide 713, the structures 712 and 720 do not have a completely cylindrical shape. Their circular cross-sections are truncated by the edge of the waveguide 713. This tends to reduce the finesse of the resonator 712, broadening its spectral peaks. As described below with reference to FIG. 14, this may be desirable when the monitoring devices 712 is used to tune the wavelength of a laser.

Because the embodiment of the invention shown in FIGS. 7A, 7B and 7C does not rely on evanescent coupling, it may provide greater photocurrents than the micro-resonators of the embodiments described above and below, that use evanescently coupled resonators. This increased photocurrent may allow the use of relatively low-finesse resonators. It is desirable, however, to form the micro-cylinders 712 and 720 in a manner that causes only relatively small amounts of scattering within the waveguide 713. Excessive scattering may introduce undesirable modes into the waveguide 713 or cause undesirable feedback into the laser.

Figure 8A:
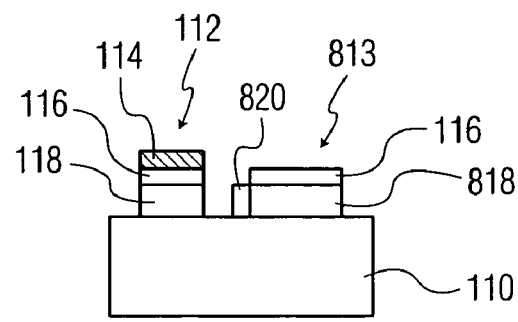
FIGS. 8A, 8B and 8C are a side-plan view, front-plan view and top plan view of an optical device including a seventh embodiment of the subject invention.
Figure 8B:
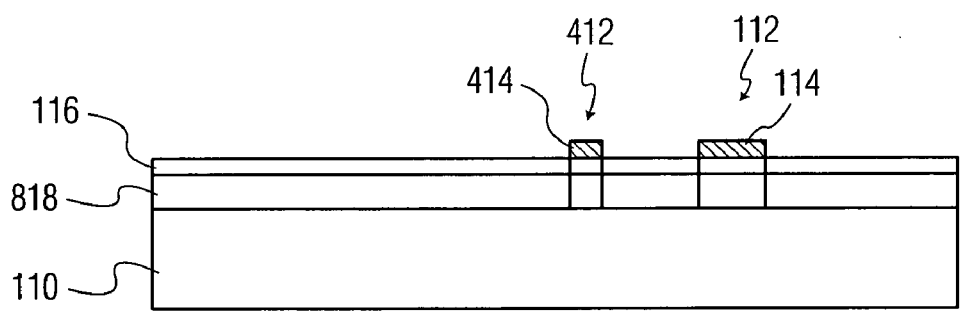
Figure 8C:
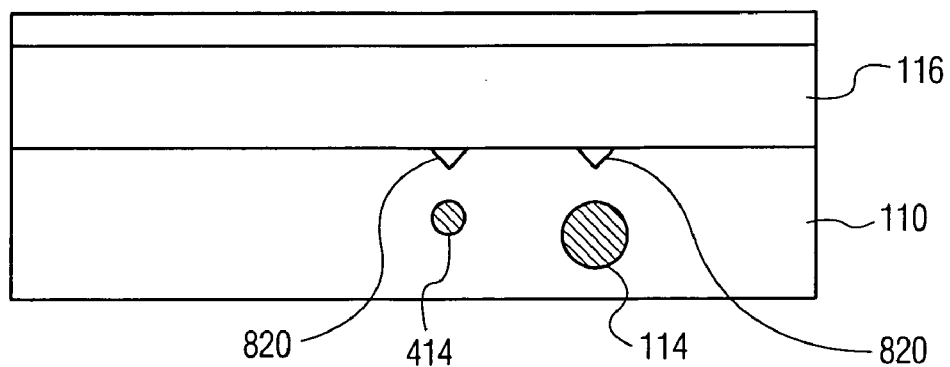

Another embodiment of the invention that uses scattering to propagate light from the waveguide to the micro-resonators is shown in FIGS. 8A, 8B and 8C. This embodiment employs a waveguide 813 that includes small structures 820 formed on one side of the waveguide 813. In the exemplary embodiment of the invention, the structures 820 are formed from the same material as the waveguide layer 818. The structures 820 may desirably locally increase the strength of the evanescent field and, so, act as antennas, broadcasting optical energy from the waveguide 813 to the micro-resonators 114 and 414.

The device shown in FIG. 8 includes a waveguide 813 formed on the top of substrate 110 from waveguide layer 818 and cladding layer 116. The micro-resonator 112 and optional power-level micro-structure 412 may be formed in the same way as described above with reference to FIG. 4. Because of the antenna effect of the structures 820, however, the micro-structures 112 and 412 may be placed at a greater distance from the waveguide 813 than the micro-resonators shown in FIG. 4.

The structures 820 are sources of scattering in the waveguide 813 and, consequently, are desirably configured to introduce only a small amount of scattering to avoid producing undesirable modes in the waveguide 813.

Figure 9A:
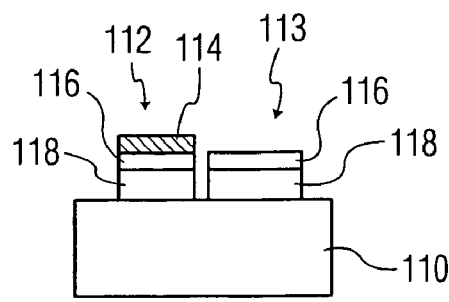
FIGS. 9A, 9B and 9C are a side-plan view, front-plan view and top plan view of an optical device which includes an eighth embodiment of the subject invention.
Figure 9B:
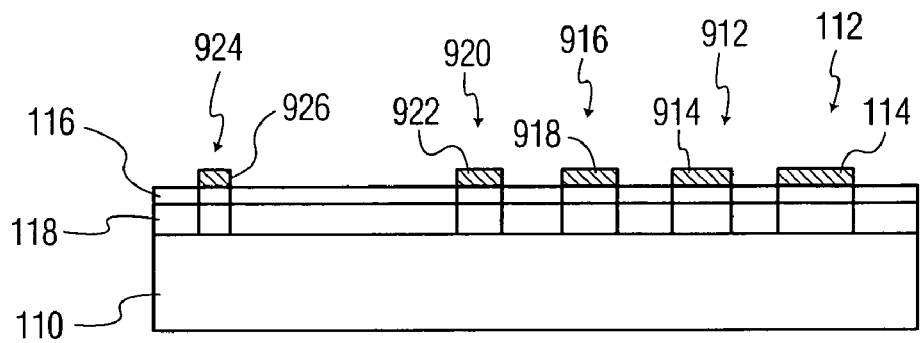
Figure 9C:
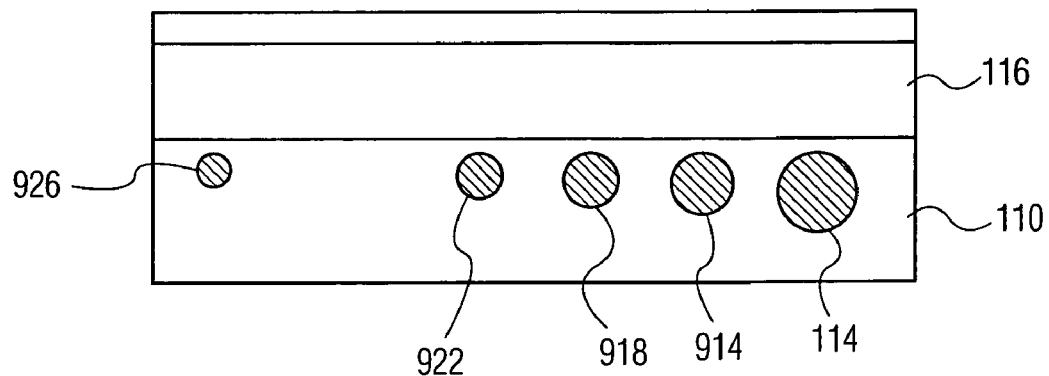

The alternative embodiment of the invention shown in FIGS. 9A, 9B and 9C employs multiple micro-cylinder resonators 112, 912, 916 and 920, each of which is tuned to a respectively different wavelength. The exemplary device also includes a power monitor micro-cylinder 924. As shown in FIGS. 9B and 9C, each of the micro-cylinders 112, 912, 916, 920 and 924 is formed on the substrate 110 from the waveguide material 118 and cladding material 116. In addition, each of the micro-cylinders 112, 912, 916, 920 and 924 has a respective electrical contact 114, 914, 918, 922 and 926. These micro-cylinders operate in the same way as the other micro-cylinders described above.

The exemplary micro-cylinders 112, 912, 916 and 920 have respectively different diameters and are configured to resonate at respectively different wavelengths that define channels in a DWDM communications system. In this embodiment of the invention, each of the micro-cylinders 112, 912, 916 and 920 is a relatively high-finesse device and the laser is tuned to one of the wavelengths by maximizing a power signal, relative to the power signal provided by the power-meter micro-cylinder 924, of a respective one of the resonators 112, 912, 916 and 920. As described above, the electrical contacts 114, 914, 918 and 922 both allow the photocurrent to be sensed and allow the respective micro-resonator to be tuned by application of a bias current. Because each micro-resonator has a different curvatures, it may also have a different finesse. This different finesse may be compensated by individually tuning the indices of refraction of the micro-resonators electronically. Injecting current into the device, however, also affects the losses exhibited by the device.

Figure 10A:
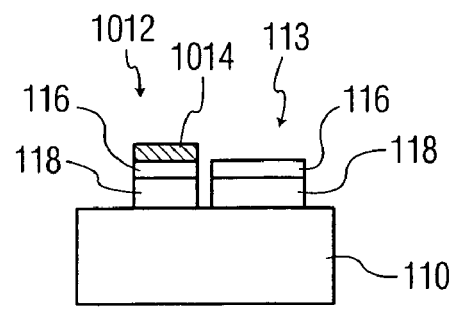
FIGS. 10A, 10B and 10C are a side-plan view, front-plan view and top plan view of an optical device that includes a ninth embodiment of the subject invention.
Figure 10B:
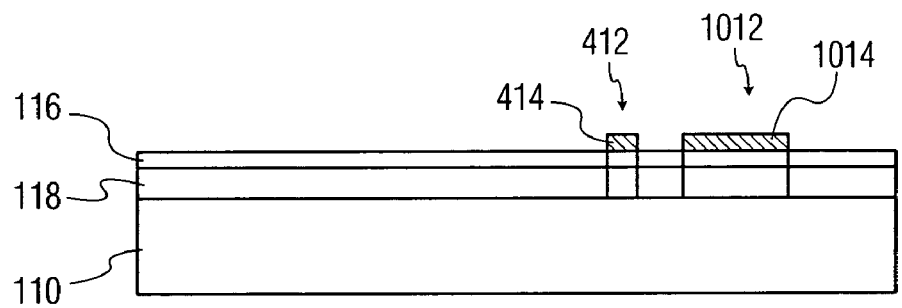
Figure 10C:
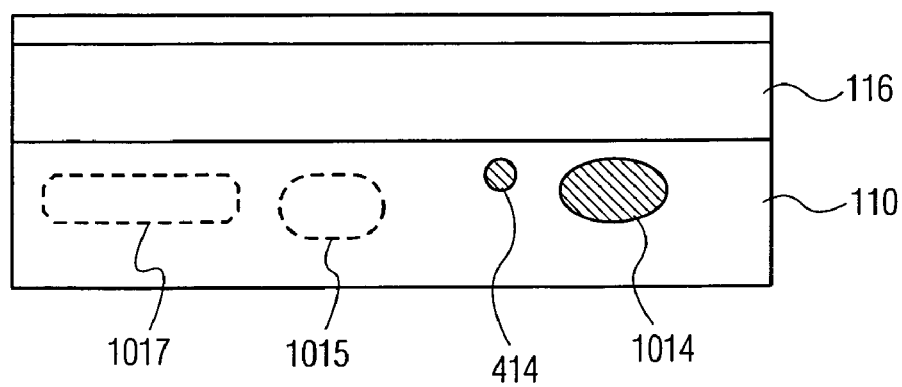

FIGS. 10A, 10B and 10C represent side, front and top-plan views of another embodiment of the invention. This embodiment employs a micro-resonator 1012 having an oval cross-section. The oval cross-section reduces the finesse of the resonator, increasing the spectral range of its resonant peaks. As described below, a micro-resonator having lower Q may be desirable when the micro-resonator is used to adjust the wavelength of a semiconductor laser. The micro-resonator 1012 is formed from oval sections of the waveguide material 118 and cladding material 116. It may also include an oval electrical contact 1014. The remainder of the device shown in FIGS. 10A, 10B and 10C is formed and operates in the same way as described above with reference to FIG. 4. Although not shown, it is contemplated that mirco-resonator 1015 (shown in phantom) having a stadium shape may also be used. Alternatively, a micro-resonator 1017 (shown in phantom) having an octagonal shape may be used. In for the resonators 1015 and 1017, the straight sides of the shapes are desirably positioned parallel to the waveguide to increase coupling between the waveguide and the resonator. Although not shown, it is contemplated that a hexagon-shaped micro-resonator may also be used. For the hexagon and octagon-shaped micro-resonators, the dominant resonant mode traces a path around the edge of the shape, reflecting from the sides on the ends of the device.

Figure 11A:
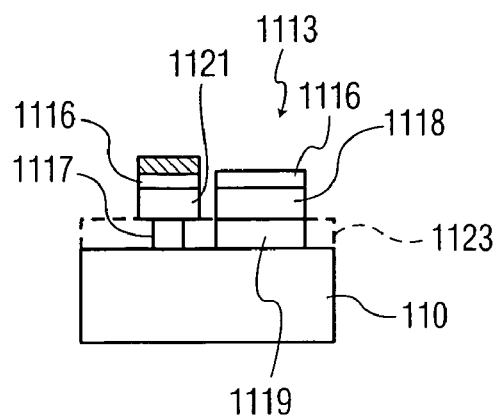
FIGS. 11A, 11B and 11C are a side-plan view, front-plan view and top plan view of an optical device comprising a tenth embodiment of the subject invention.
Figure 11B:
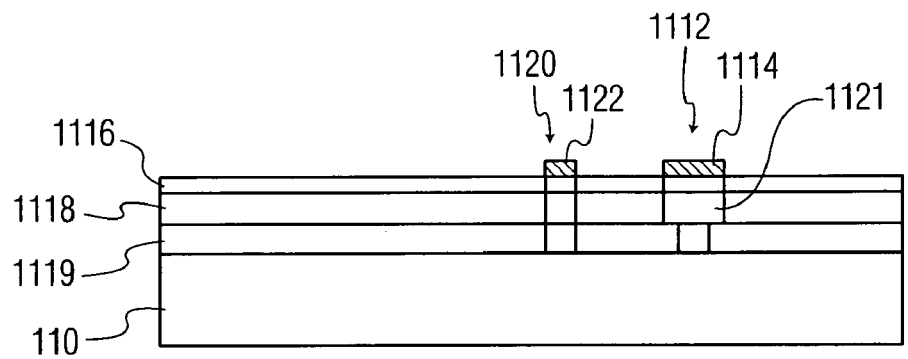
Figure 11C:
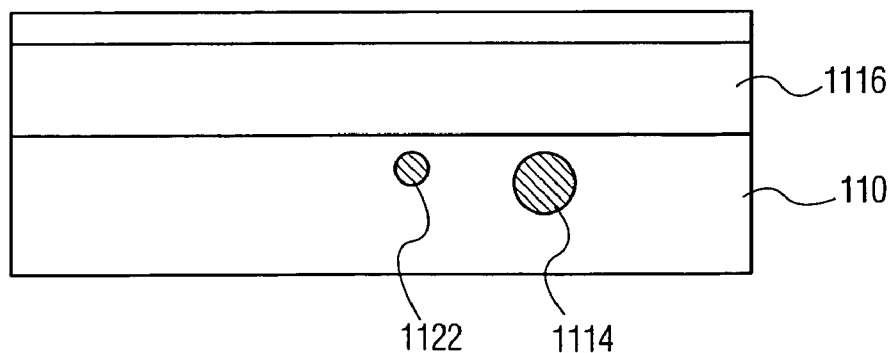

Another exemplary embodiment of the invention is shown in FIGS. 11A, 11B and 11C. This embodiment employs a disc instead of a micro-cylinder as the micro-resonator. The described exemplary embodiment of the invention includes a micro-cylinder power-monitor 1120. In this embodiment, the disc 1121 may be formed from the waveguide material 1118 on top of a pedestal 1117 that may be formed from an N-type material 1119 on the N-type substrate 110. The exemplary pedestal 1117 may be formed at the same time as an N-type sub-layer for the waveguide 1113. The N-type material 1119 desirably has an index of refraction than is no greater than that of the substrate 110. The pedestal is patterned to have a smaller cross-section than the disc 1121. Next, an optional layer of low-index dielectric or intrinsic material 1123, having a lower refractive index than the waveguide layer 1118 is deposited and the device is polished to expose the top surface of the pedestal 1117 and the sub-layer on which the waveguide is formed. Next, the disc 1121 and waveguide are formed from the waveguide material 1118, as shown in FIGS. 11A through 11C. At the next step, the cladding layer 1116 is formed on top of the waveguide layer 1118 and electrical contacts 1122 and 1114 are formed to complete the power monitor micro-cylinder 1120 and the disc micro-resonator 1112.

As an alternative to forming the pedestal to have a smaller cross-section than the disc, it is contemplated that the pedestal may be formed using a plane-selective etchant that undermines the edges of the disc to form a pedestal structure beneath the disc.

A micro-resonator operating in whispering gallery mode propagates light in a ring around the outer surface of the micro-resonator. Thus, the described disc micro-resonator has greater finesse than the micro-cylinder resonators, described above, because the outer portion of the disc has a higher difference in its refractive index from the material below it than in the previous embodiments.

Although the exemplary embodiment is shown as having a layer of intrinsic material 1123 below the outer portion of the disc resonator, it is contemplated that the material 1123 may be, instead, a sacrificial layer that is removed some time after the waveguide material has been deposited. In this alternative embodiment, the material 1123 may be, for example, SiO$_2$ which is removed using an HF etchant after forming the cladding layer but before forming the metal contacts 1114 and 1122.

In addition, although the exemplary embodiment shows the disc 1121 being separated from the waveguide 1113, it is contemplated that it may be physically coupled to the waveguide 1113 in the same way that the micro-resonator 712 is coupled to the waveguide 713, as shown in FIG. 7. In this configuration the disc 1121 receives light from the waveguide 1113 via leaky-mode coupling.

Figure 12A:
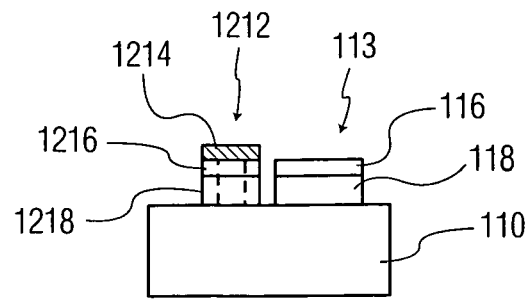
FIGS. 12A, 12B and 12C are a side-plan view, front-plan view and top plan view of an optical device that includes an eleventh embodiment of the subject invention.
Figure 12B:
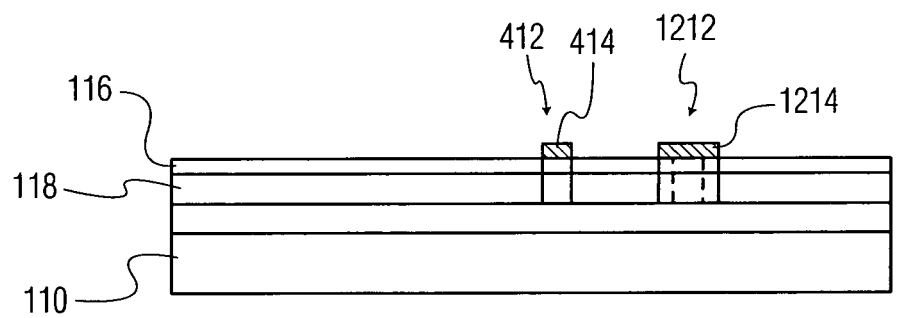
Figure 12C:
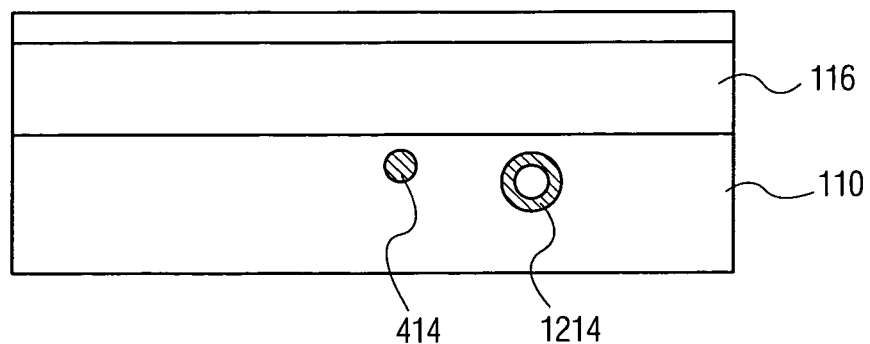

In another alternative embodiment of the invention, shown in FIGS. 12A, 12B and 12C, the micro-resonator is a ring resonator 1212, having a central portion 1215 that has a lower refractive index than the outer portion 1217. This device may be formed in the same way as the device shown in FIG. 4 except that the micro-cylinder 1212 is formed from a hollow cylinder 1218 of the waveguide material 118 and a hollow cylinder 1216 of the cladding material 116. The resonator 1212 and is capped with a hollow cylinder 1214 metallization. The power monitor micro-structure 412 and the waveguide 113 are formed in the same way as described above with reference to FIG. 4.

The device shown in FIGS. 12A, 12B and 12C may have advantages over the devices which use micro-cylinder or disc resonators because the ring resonator tends to prevent modes that reflect across arcs of resonator, that is to say, modes other than the whispering gallery modes and, thus, may be more sensitive.

Although the resonator 1212 is shown as a hollow cylinder, it is contemplated that it may be filled, for example, with a dielectric material, such as the material 320 shown in FIG. 3. As in FIG. 3, this material may also surround both the waveguide 113 and the micro-resonator 1212.

In addition, although the exemplary embodiment shows the ring resonator 1212 being separated from the waveguide 113, it is contemplated that it may be physically coupled to the waveguide 113 in the same way that the micro-resonator 712 is coupled to the waveguide 713, as shown in FIG. 7. In this configuration the ring resonator 1212 receives light from the waveguide 113 via leaky-mode coupling.

Figure 13A:
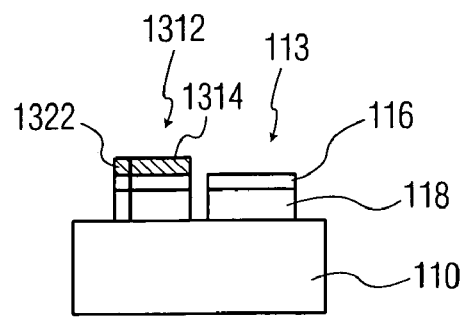
FIGS. 13A, 13B and 13C are a side-plan view, front-plan view and top plan view of an optical device which comprises a twelfth embodiment of the subject invention.
Figure 13B:
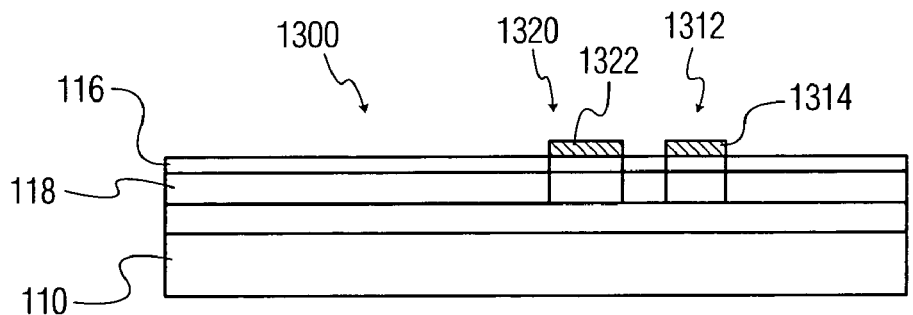
Figure 13C:
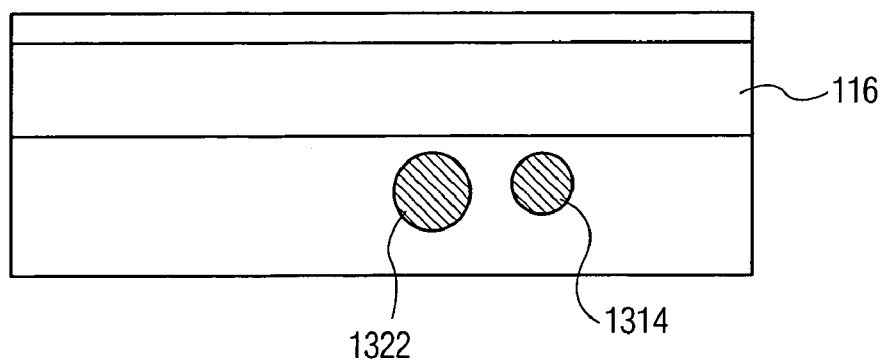

FIGS. 13A, 13B and 13C illustrate yet another exemplary embodiment of the invention, including two micro-resonator structures 1312 and 1320. These structures have different diameters and, so, resonate at different wavelengths. Each of the two resonators is formed on the substrate 110 from discs of the waveguide material 118 and cladding material 116. Each resonator 1312 and 1320 is capped with a respective contact 1314 and 1322.

Rather than tuning each resonator to a different channel of the DWDM system, as described above with reference to FIGS. 9A, 9B and 9C, however, the embodiment shown in FIGS. 13A–13C forms the two resonators so that, near the desired wavelength band, the resonance peak of one micro-resonator occurs at approximately the same wavelength as the midpoint in the slope of the other micro-resonator.

Figure 14:
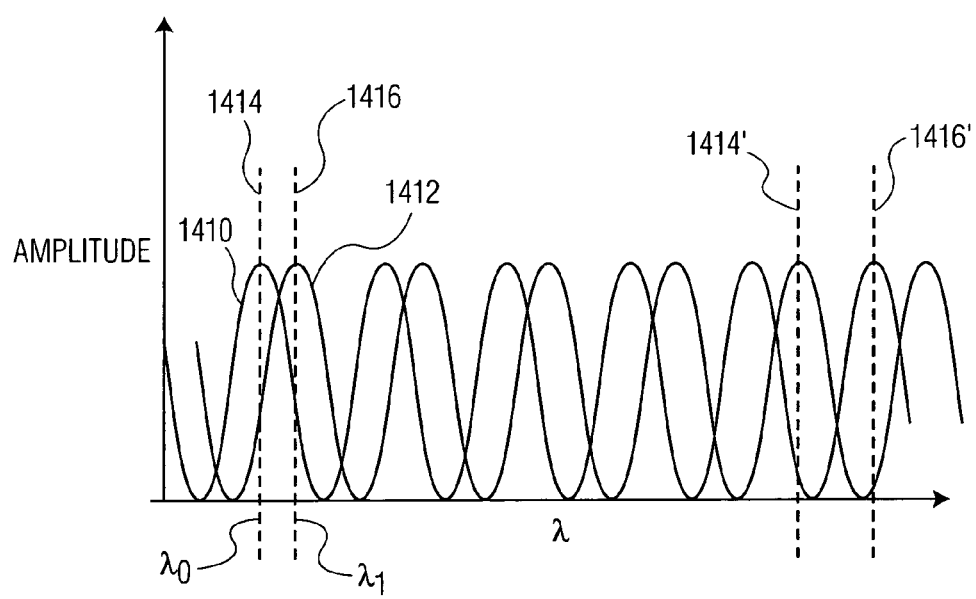
FIG. 14 is a graph of wavelength versus amplitude that is useful to describe the operation of the embodiment of the invention shown in FIGS. 13A, 13B and 13C.

This may be described more easily with reference to FIG. 14. FIG. 14 is a graph of amplitude versus wavelength that illustrates the response of the two micro-resonators 1312 and 1320, shown in FIGS. 13A–13C. In FIG. 14, graph 1410 represents the response of the resonator 1312 and graph 1412 represents the response of resonator 1420. As shown by the line 1414, at the wavelength of interest, $\lambda_0$, the peak in the response of micro-resonator 1312 corresponds to the mid-point in the slope of the response of resonator 1320. U.S. Pat. No. 6,323,987 entitled, CONTROLLED MULTI-WAVELENGTH ETALON, describes a method of tuning a laser using the slope of a response curve. This method is desirable because relatively small changes in the frequency of the laser light can be sensed and corrected.

By designing the micro-resonators 1314 and 1320 to have relative sizes and free-spectral ranges such that, at least over a few cycles of the response curve, the successive slopes of the resonators occur at wavelengths that represent successive channels in the DWDM system, a single laser may be tuned over multiple channels within that range. For example, as shown in FIG. 14, if $\lambda_0$ represents one DWDM channel and $\lambda_1$ represents the next channel, then the laser may be tuned to $\lambda_0$ on the positive-going slope of the response curve 1412 and to $\lambda_1$ on the negative-going slope of the response curve 1410.

Because the two micro-resonators have different diameters, they have different resonant wavelengths and different free spectral ranges. Consequently, the effect, described above, in which the peak of one response curve coincides with the slope of the other response curve is only maintained over a certain range of wavelengths. As shown in FIG. 14, for example, the alignment between the peaks and slopes of the curves 1410 and 1412 is less desirable at wavelengths $\lambda_N$ and $\lambda_{N+1}$ indicated by the lines 1414' and 1416' than it is at $\lambda 0$ and $\lambda 1$. The spacing between the wavelengths $\lambda_N$ and $\lambda_{N+1}$ does not correspond to the spacing between adjacent DWDM channels. Thus, the device shown in FIG. 13A through 13C may be effectively used only over definite range of wavelengths, which may be less than the full span of a DWDM system.

The range over which a system may be used, however, may be expanded by using more than two micro-resonators, as shown in FIG. 9, or by forming the two micro-resonators to have free-spectral ranges that are approximately matched by using larger micro-resonators operating on higher mode whispering gallery modes.

While the invention has been described in terms of exemplary embodiments, it is contemplated that it may be practiced as described above within the scope of the appended claims. For example, although the exemplary embodiments are shown as using disc micro-resonators that operate in whispering gallery modes, it is contemplated that other types of resonators, operating in other modes may be used instead. For example, rectangular resonators having a resonant length between their ends may be used in place of the disc resonators.

What is claimed:

1. A tunable semiconductor laser system comprising:
   a semiconductor laser, formed on a semiconductor substrate, including an optical gain medium having an index of refraction and an optical path length, the laser producing laser light at a predetermined wavelength;
   tuning means, coupled to the substrate and responsive to a tuning signal to adjust one of the index of refraction and the optical path length of the optical gain medium to change the predetermined wavelength of the laser light;
   a micro-resonator structure formed on the semiconductor substrate and optically coupled to the optical gain medium and including an optical sensor configured to provide an electrical output signal, wherein the micro-resonator is configured to resonate when light at a predetermined wavelength propagates through the optical gain medium and to provide the electrical output signal having a peak value in response to light at the predetermined wavelength; and
   control circuitry coupled the micro-resonator and to the tuning means for providing the tuning signal in response to the output signal of the micro-resonator structure.

2. A tunable semiconductor laser system according to claim 1, wherein the micro-resonator is a micro-cylinder.

3. A tunable semiconductor laser system according to claim 1, wherein the micro-resonator is positioned with respect to the optical gain medium so that light propagating through the optical gain medium is received by the micro-resonator via evanescent coupling.

4. A tunable semiconductor laser system according to claim 3, wherein each of the optical gain medium and the micro-resonator has a refractive index and the device further includes a cladding material positioned between the optical gain medium and the micro-resonator, the cladding material having an refractive index less than the refractive index of both the optical gain medium and the micro-resonator.

5. A tunable semiconductor laser system according to claim 1, wherein the micro-resonator is physically coupled to the optical gain medium so that light propagating through the optical gain medium is received by the micro-resonator through leaky-mode coupling.

6. A tunable semiconductor laser system according to claim 1, further including circuitry for applying a bias signal to the micro-resonator to cause the micro-resonator to resonate at a different wavelength.

7. A tunable semiconductor laser system according to claim 1, further including means, for measuring an amount of optical power propagating through the optical gain medium to provide a power level signal.

8. A tunable semiconductor laser system according to claim 7, wherein the means for measuring comprises a micro-structure, having a resonant length less than any wavelength of light that propagates through the optical gain medium.

9. A tunable semiconductor laser according to claim 7, wherein the means for measuring comprises a micro-structure having a plurality of resonant modes such that light having wavelengths in a range of interest for the tunable semiconductor laser resonates in the micro-structure.

10. A tunable semiconductor laser system according to claim 8, wherein the micro-structure is positioned with respect to the optical gain medium so that light propagating through the optical gain medium is received by the micro-structure via evanescent coupling.

11. A tunable semiconductor laser according to claim 8, wherein the micro-structure is physically coupled to the optical gain medium so that light propagating through the optical gain medium is received by the micro-structure through leaky-mode coupling.

* * * * *